US011240932B1

(12) United States Patent
Andrade

(10) Patent No.: US 11,240,932 B1
(45) Date of Patent: Feb. 1, 2022

(54) COLD PLATE

(71) Applicant: Waymo LLC, Mountain View, CA (US)

(72) Inventor: Justin Matthew Andrade, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 206 days.

(21) Appl. No.: 16/047,429

(22) Filed: Jul. 27, 2018

(51) Int. Cl.
*H05K 7/20* (2006.01)
*F28F 7/02* (2006.01)

(52) U.S. Cl.
CPC ........... *H05K 7/20254* (2013.01); *F28F 7/02* (2013.01); *H05K 7/20172* (2013.01); *H05K 7/20854* (2013.01); *H05K 7/20863* (2013.01); *H05K 7/20872* (2013.01); *F28F 2250/08* (2013.01)

(58) Field of Classification Search
CPC .... F28F 7/02; F28F 2250/08; H05K 7/20172; H05K 7/202; H05K 7/20254; H05K 7/20854; H05K 7/20863; H05K 7/20872; H05K 7/20754
USPC ....... 165/80.3, 80.4, 104.11, 104.19, 104.28, 165/104.31, 120, 122
See application file for complete search history.

(56) References Cited

U.S. PATENT DOCUMENTS

| 5,771,788 | A  | * | 6/1998  | Lee      | A21C 13/00 |
|           |    |   |         |          | 99/468 |
| 7,436,660 | B2 | * | 10/2008 | Pedoeem  | H04L 12/18 |
|           |    |   |         |          | 361/690 |
| 8,724,315 | B2 | * | 5/2014  | Branton  | H05K 7/20763 |
|           |    |   |         |          | 361/679.53 |
| 9,326,419 | B2 | * | 4/2016  | Chen     | H05K 7/20127 |
| 9,481,241 | B2 |   | 11/2016 | Jackson  | |
| 9,661,783 | B2 | * | 5/2017  | Sakuma   | H05K 7/20909 |
| 9,795,067 | B2 | * | 10/2017 | Takezawa | H02M 7/48 |
| 9,885,526 | B2 | * | 2/2018  | Maranville | F25B 1/00 |
| 10,130,006 | B2 | * | 11/2018 | Papoulis | H05K 7/202 |
| 2002/0117291 | A1 | * | 8/2002 | Cheon   | G06F 1/20 |
|           |    |   |         |          | 165/80.4 |
| 2005/0201055 | A1 | * | 9/2005 | Jyo     | H05K 7/202 |
|           |    |   |         |          | 361/695 |
| 2006/0161311 | A1 | * | 7/2006 | Vinson  | G06F 1/20 |
|           |    |   |         |          | 700/300 |
| 2006/0227504 | A1 | * | 10/2006 | Chen   | H05K 7/20927 |
|           |    |   |         |          | 361/679.47 |

(Continued)

FOREIGN PATENT DOCUMENTS

| DE | 102016011879 A1 | 4/2018 | |
| JP | 2011191974 A * | 9/2011 | |
| WO | WO-2013076853 A1 * | 5/2013 | ......... H05K 7/20727 |

OTHER PUBLICATIONS

Machine Translation WO 2013/076853 A1 (Year: 2013).*

*Primary Examiner* — Len Tran
*Assistant Examiner* — Gustavo A Hincapie Serna
(74) *Attorney, Agent, or Firm* — Botos Churchill IP Law

(57) ABSTRACT

This technology relates to a cooling system for reducing the amount of heat within a sensor housing. The system comprising a cold plate containing an interior liquid cooling channel containing a cooling fluid, a heat exchanger attached to the cold plate, and at least one fan configured to generate an air flow loop. The heat exchanger is configured to draw heat from the air flow loop and pass the drawn heat to the cold plate, which in turn, passes the drawn heat to the cooling liquid.

20 Claims, 12 Drawing Sheets

(56) References Cited

U.S. PATENT DOCUMENTS

| | | | |
|---|---|---|---|
| 2009/0086434 A1* | 4/2009 | Hodes | H05K 7/20754 361/700 |
| 2009/0225515 A1* | 9/2009 | Hom | H05K 7/20781 361/701 |
| 2011/0023505 A1* | 2/2011 | Popov | A23G 9/08 62/89 |
| 2011/0203770 A1* | 8/2011 | Rowe | H05K 7/202 165/80.1 |
| 2011/0308777 A1* | 12/2011 | O'Connor | F04D 17/16 165/121 |
| 2012/0188717 A1* | 7/2012 | Albrecht | G01R 33/3614 361/699 |
| 2014/0260398 A1* | 9/2014 | Kozu | F24F 3/1417 62/271 |
| 2015/0299014 A1* | 10/2015 | McLaine | C02F 9/00 210/167.3 |
| 2016/0221458 A1 | 8/2016 | Lopez et al. | |
| 2016/0302330 A1* | 10/2016 | Hamari | H02M 7/003 |
| 2017/0280593 A1* | 9/2017 | Magallanes | H05K 7/20754 |
| 2017/0325354 A1* | 11/2017 | Lee | H05K 5/0213 |
| 2018/0048060 A1* | 2/2018 | Be | H01Q 1/42 |
| 2018/0099592 A1* | 4/2018 | Curry, V | G08B 25/00 |
| 2018/0206365 A1* | 7/2018 | Norton | H05K 7/20727 |
| 2018/0356528 A1* | 12/2018 | Schaffner | G01S 7/4917 |
| 2019/0200489 A1* | 6/2019 | Martinez Garcia | H05K 7/20609 |
| 2019/0310032 A1* | 10/2019 | Nishiyama | F28F 1/40 |
| 2020/0001682 A1* | 1/2020 | Lee | B60H 1/00492 |
| 2020/0390001 A1* | 12/2020 | Diehl | H05K 7/20145 |

\* cited by examiner

COLD PLATE

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location without the need for additional input from the passenger or any other human. Thus, such vehicles may be used to provide transportation services.

Various types of vehicles, such as cars, trucks, motorcycles, busses, boats, airplanes, helicopters, lawn mowers, recreational vehicles, amusement park vehicles, farm equipment, construction equipment, trams, golf carts, trains, trolleys, etc., may be equipped with various types of sensors in order to detect objects in the vehicle's environment. For example, vehicles, such as autonomous vehicles, may include sensors such as LIDAR, radar, sonar, camera, or other such imaging sensors that scan and record data from the vehicle's environment. Sensor data from one or more of these sensors may be used to detect objects and their respective characteristics (position, shape, heading, speed, etc.).

Operation of these sensors may be adversely effected by the buildup of heat within the sensor itself. Typically, the sensors include a housing to protect the internal sensor components of the sensors from debris and contaminants, but over time, the housing may trap solar heat, as well as heat generated by the various internal components of the sensor. As such, the sensor components may be subjected to sub-optimal temperature conditions during operation.

BRIEF SUMMARY

One aspect of the disclosure provides a cooling system for reducing an amount of heat within a sensor housing. The system includes a cold plate containing an interior liquid cooling channel containing a cooling fluid; a heat exchanger attached to the cold plate; and at least one fan configured to generate an air flow loop, wherein the heat exchanger is configured to draw heat from the air flow loop and pass the drawn heat to the cold plate, which in turn, passes the drawn heat to the cooling fluid.

In some instances, the cooling fluid is one or more of water, propylene glycol, ethylene glycol, or diethylene glycol. In some examples, the cooling fluid contains at least one additive selected from a group of anti-corrosion or antimicrobial compounds.

In some instances, the heat exchanger is a plate heat exchanger or a fin stack.

In some instances, the cooling system further includes the sensor housing, wherein the sensor housing includes an upper portion, a lower portion, and a middle portion positioned between the upper portion and lower portion. In some examples, the upper portion is positioned between the sensor housing and a separating structure; the lower portion is positioned between the sensor housing and the cold plate; and the middle portion is positioned between the separating structure and the cold plate. In some examples, the air flow loop comprises two air flow loops, a first of the two air flow loops flowing between the lower portion and middle portion and a second of the two air flow loops flowing between the lower portion, middle portion, and upper portion. In some examples, the first air flow loop is perpendicular to the second air flow loop.

In some instances, the air flow loop is generated by a first fan and a second fan of the at least one fan. In some examples, the first fan and second fan are configured to blow in opposite directions.

In some instances, the air flow loop is generated by a third fan and a fourth fan of the at least one fan. In some examples, the third fan and fourth fan are configured to blow in opposite directions.

In some instances, the cooling system includes a pump, wherein the pump circulates the cooling fluid within a cooling loop.

In some instances, the cooling system includes a second heat exchanger, wherein the cooling liquid passes through the second heat exchanger and the second heat exchanger cools the cooling fluid to a predefined temperature. In some examples, the second heat exchanger is positioned outside of the sensor housing.

In some instances, the cooling system includes one or more sensor components mounted to the cold plate. In some examples, the cold plate is configured to draw heat away from the one or more sensor components.

In some instances, the cold plate includes at least four pass-throughs positioned 90 degrees apart for allowing the air flow loop to pass through the cold plate. In some examples, each of the at least four pass-throughs has a respective fan mounted in proximity.

In some instances, two of the at least four fans are configured to pull air through their respective pass-throughs and two of the at least four fans are configured to push air through their respective pass-throughs.

DETAILED DESCRIPTION

Figure 1:
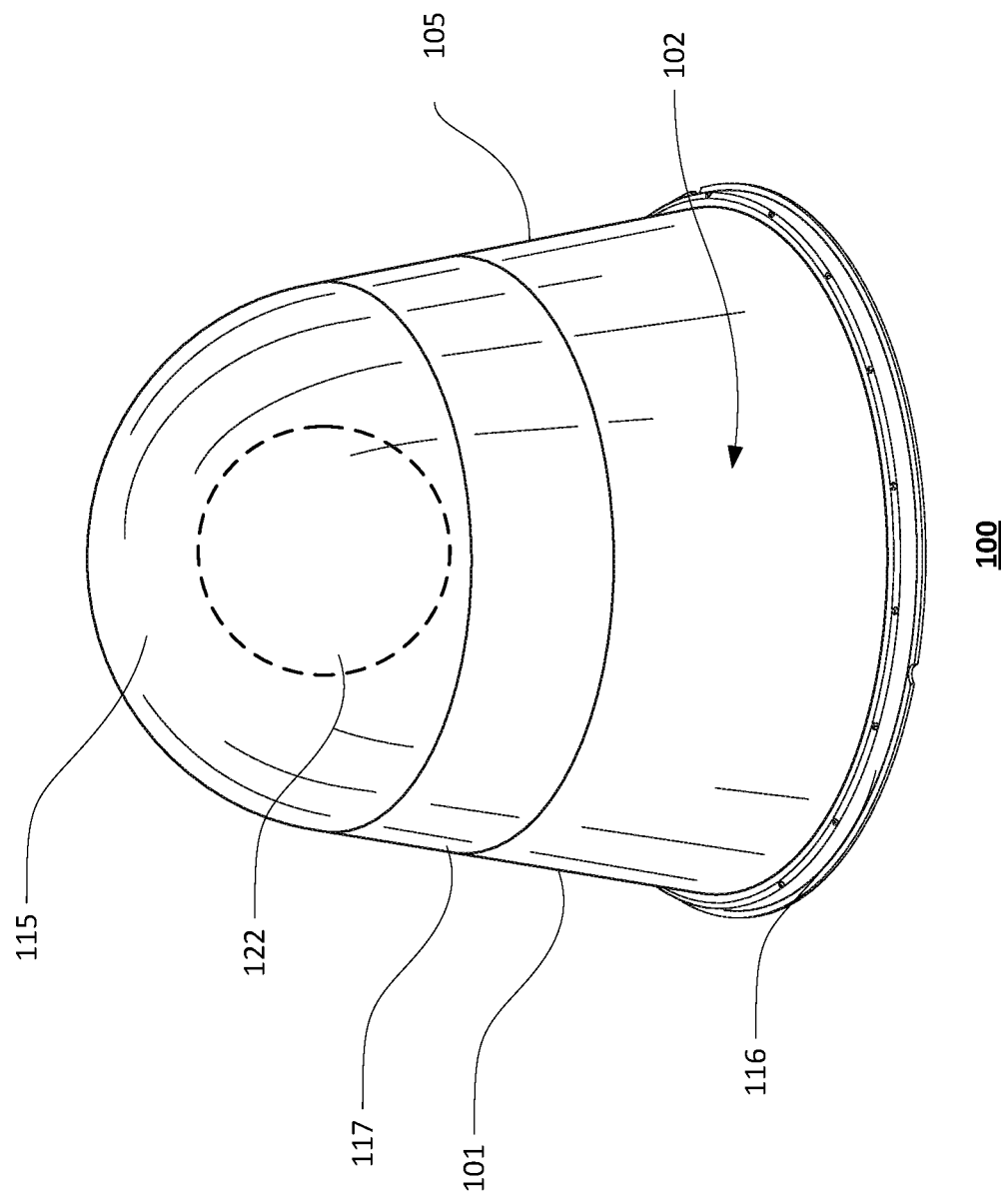
FIG. 1 is an example external view of a sensor housing with internal sensor components in accordance with aspects of the disclosure.

This technology relates to cooling the interior of a sensor housing, and associated computer components positioned therein, by using a cold plate and discrete, convective air flows. In this regard, a sensor may be comprised of internal sensor components, such as sensors and processors, and housing. The housing may protect the internal sensor components and processors from elements, such as rain, snow, dust and other such debris. However, operation of the internal sensor components, as well as solar energy which pass through the housing, may result in excessive heat being generated or otherwise stored within the housing. For instance, and as illustrated in FIG. 1, when the ambient temperature of the interior 102 of a sensor 100 (i.e., within the temperature within the sensor housing 101,) is above a certain temperature, such as 65 degrees Celsius, or more or less, the internal sensor components 122 may prematurely degrade. In some instances, overheating of the sensor components 122 may make them inoperable.

To dissipate the heat, a cold plate may be used in conjunction with a plurality of fans to cool the interior of the sensor and the components therein. For instance, the cold plate may include a liquid cooling loop, wherein a cooling liquid may circulate through the cold plate. The cooling loop may cool electronics, such as processors and printed circuit boards (PCBs) attached thereto. The cooling liquid may cool the cold plate, thereby causing the cold plate to draw the heat away from the processors, PCBs, and other such components attached or in proximity of the cold plate. The cooling liquid, containing the heat energy drawn in by the cold plate, may then be passed out of the cold plate and the interior of the sensor. The cooling liquid may then be cooled back down to the predetermined temperature.

The interior of the sensor housing may include an upper portion, housing internal sensor components, such as a LIDAR. The sensor may also include a middle portion located between the cold plate and the upper portion, housing other internal sensor components such as cameras. A separating structure, such as a sealing plate or mounting plate may separate the upper portion from the middle portion. In some instances, a pair of openings may be positioned on opposing ends of the separating structure to allow for air to circulate into and out of the upper portion.

Two discrete air flow loops may be generated by fans within the interior of the sensor housing to cool the internal sensor components. The first air flow loop may flow through the middle portion of the sensor housing into the upper portion to cool the internal sensor components in the upper portion. The first air flow loop may then flow from the upper portion back through the middle portion and into the lower portion of the sensor housing. A second air flow loop may flow from the lower portion into the middle portion, and back down into the lower portion of the sensor housing. The second air flow loop may cool internal sensor components within the middle portion.

A heat exchanger may be attached to the base of the cold plate to pull heat from air circulating at the base (i.e., the portion of the cold plate facing away from the other interior components within the sensor housing,) as described herein. The heat exchanger below the cold plate may pull the heat from the two air flow loops generated by the two pairs of fans. As explained herein, the heat may then be passed out of the interior of the sensor through the cooling liquid.

The features described herein allow for efficient dissipation of heat within the sensor housing. In this regard, separate air flow loops provide discrete, targeted cooling for different sections of the sensor housing. As such, the heat generated by the sensor components in each section of the sensor housing, as well as the heat generated by solar radiation may be effectively removed. In addition, a cold plate may draw the heat generated by sensor components and processors into a liquid cooling loop, to reduce the likelihood of the internal sensor components and processors from degrading and/or overheating.

Figure 2:
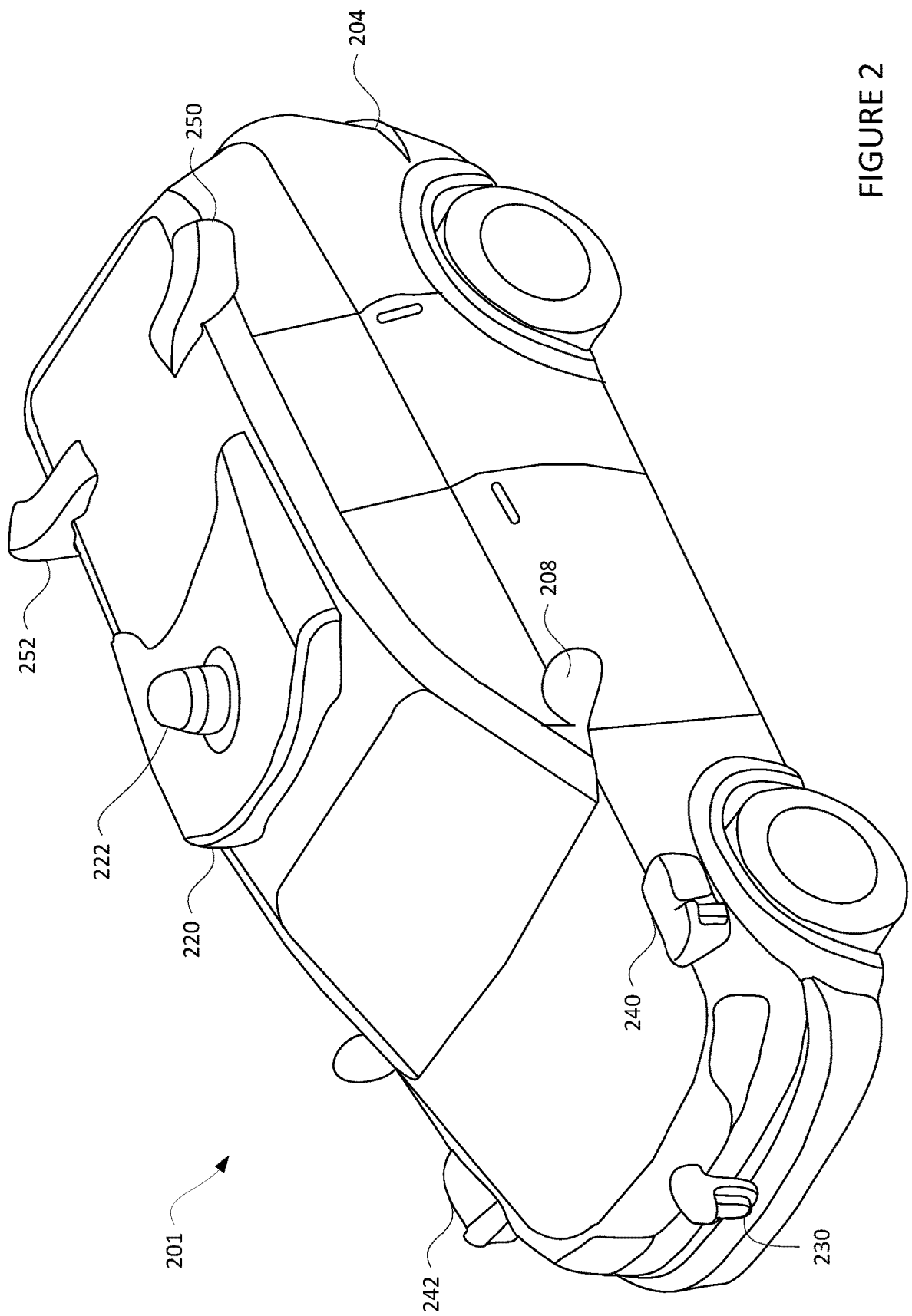
FIG. 2 is an example representative view of a vehicle with sensor housings in accordance with aspects of the disclosure.

A vehicle may have one or more sensors to detect objects external to the vehicle such as other vehicles, obstacles in the roadway, traffic signals, signs, trees, etc. For example, the vehicle 201, as shown in FIG. 2, may include sensors, such as sensor 100 in FIG. 1. Such sensors may include lasers, sonar, radar, cameras and/or any other detection devices that capture images and record data which may be processed by computing devices within the vehicle. The vehicle's sensors, such as LIDAR, radar, cameras, sonar, etc. may capture images and detect objects and their characteristics such as location, orientation, size, shape, type, direction and speed of movement, etc. Images may include the raw (i.e., unprocessed) data captured by the sensors and/or pictures and videos captured by camera sensors. Images may also include processed raw data. For instance, the raw data from the sensors and/or the aforementioned characteristics can be quantified or arranged into a descriptive function or vector for processing by the computing devices. The images may be analyzed to determine the vehicle's location, and to detect and respond to objects when needed.

The sensors may be arranged around the vehicle's exterior or interior. For example, housings 230, 240, 242, 250, 252 may include, for example, one or more LIDAR devices therein. The sensors may also be incorporated into the typical vehicle components, such as taillights/turn signal lights 204 and/or side view mirrors 208. In some instances a laser, radar, sonar, camera or other sensors may be mounted on the roof, such as in housing 222, attached to mount 220.

Sensor 100 may include a housing 101 in which the internal sensor components 122 may be positioned, as further shown in FIG. 1. The housing of the sensor may be configured in various shapes and sizes. For instance, the sensor housing 101 may be configured such that it has a domed shaped portion 115 with a side wall 105 in the shape of a frustum. The sensor housing 101 may be comprised of materials such as aluminum, magnesium, steel, plastic, glass, polycarbonate, polystyrene, acrylic, polyester, etc.

In some instances, the sensor housing may not completely cover the sensor. In this regard, the housing 101 may cover only a portion of the internal sensor components 122, while uncovered portions of the internal sensor components 122 may be within a vehicle, such as vehicle 201, or open to the environment external to the sensor 100. The housing 101 may include one or more openings to the external environment or to the vehicle 201.

A cover window through which the internal sensor components may transmit and receive signals may be incorporated in the housing. For instance, as further shown in FIG. 1, a portion of the side wall 105 of the housing 101 may be constructed as a cover window 117, to allow signals to penetrate the housing 101. Although only a portion of the side wall 105 is shown as being the cover window 117, in some instances the entire side wall 105 and/or housing 101, or portions thereof, may be constructed as cover windows. The cover window 117 may be composed of the same, or different, material(s) as the housing 101. In some instances, multiple cover windows may be incorporated into the housing.

Figure 3:
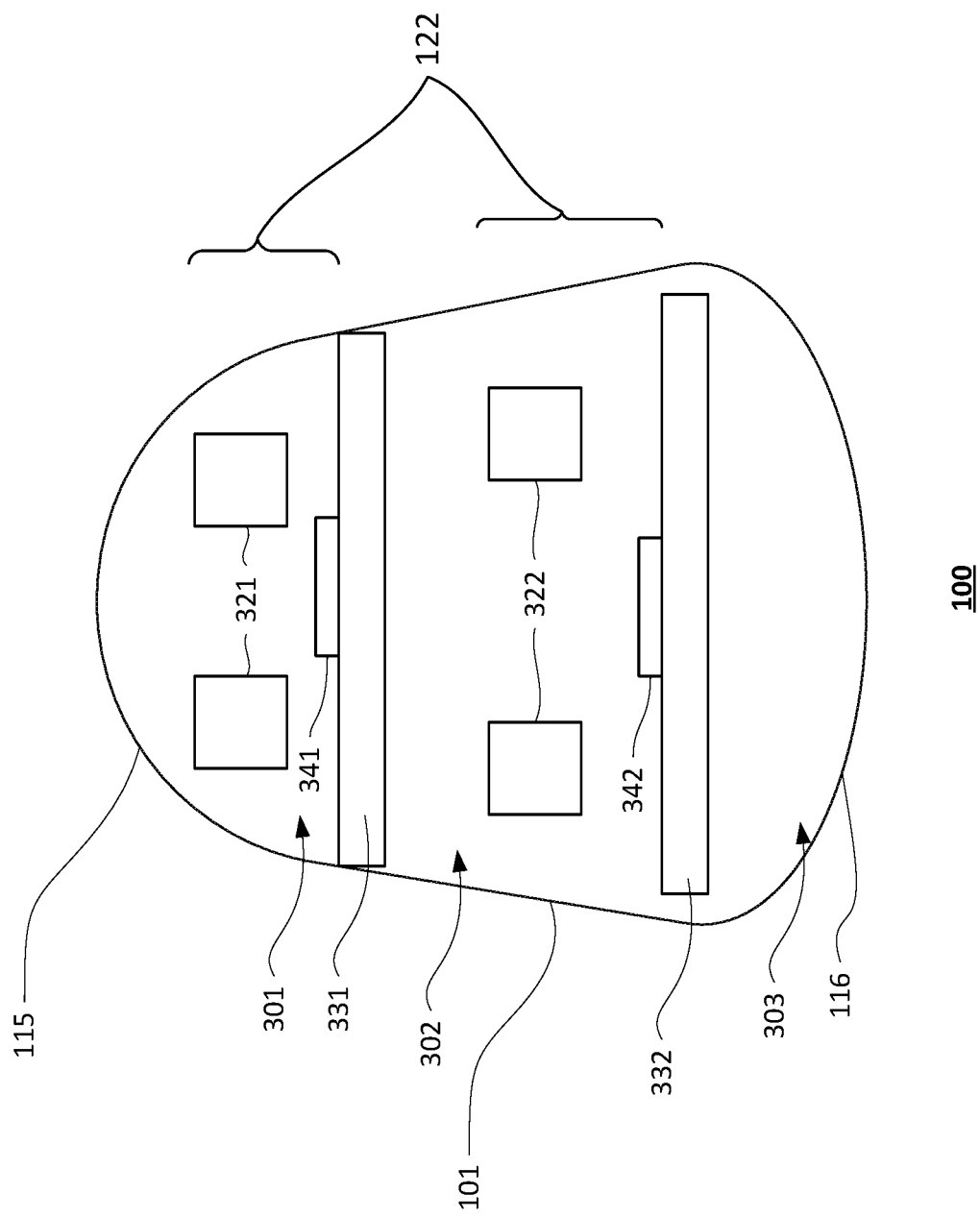
FIG. 3 is an example internal view of the internal configuration of a sensor in accordance with aspects of the disclosure.

The internal sensor components 122 of sensor 100 may include the imaging sensors such as LIDAR, radar, sonar, camera, or other such imaging sensors, as well as other components associated therewith, including but not limited to processors, memory, power supplies, etc. Internal sensor components may also include mounting hardware for mounting the imaging sensors and components associated therewith. For instance, and as illustrated in FIG. 3, internal sensor components 122 may include LIDAR imaging sensors 321 and a corresponding processor 341, as well as camera imaging sensors 322 with corresponding processor 342. Although FIG. 3 illustrates only LIDAR and camera imaging sensors, and processors associated therewith, a sensor may include any number and combination of internal sensor components. For instance, a sensor may include a single radar imaging sensor, a radar sensor with three LIDARS and multiple processors, or other such combinations.

The interior of the sensor housing may include an upper portion, a middle portion, and a lower portion. A separating structure, such as a sealing plate or mounting plate may separate the upper portion from the middle portion. For instance, FIG. 3 illustrates an upper portion 301, middle portion 302, and lower portion 303. The upper portion 301 is located between the domed shaped portion 115 of the sensor housing and a separating structure 331. LIDARs 321 and processor 341 are mounted or otherwise positioned within the upper portion 301. The middle portion 302 is positioned between the separating structure 331 and cold plate 332. Cameras 322 and processor 342 are mounted or otherwise positioned within the middle portion 302. The lower portion 303 is positioned between the cold plate 332 and the base of the sensor housing 116. Although FIG. 3 illustrates the cold plate 332 as being offset from the sensor housing, the cold plate may be flush against the sensor housing 101 and/or a seal may be used to create an air and/or other such fluid seal between the cold plate 332 and sensor housing 101.

The separating structure may be configured to mount internal sensor components, cooling components, such as fans, and create a barrier between the upper portion and middle portion of the sensor housing. Although FIG. 3 illustrates the separating structure as being flush against the sensor housing 101, the separating structure may alternatively be offset from the sensor housing 101. In some instances, a seal, such as rubber or cork gaskets, foam or plastic baffles, etc., may be positioned around the separating structure to prevent air and/or other fluids from flowing from one portion to another.

The sensor may include more than one middle portion, with each middle portion being positioned between separating structures and/or cold plates. In this regard, sensor housing 101 may include more than one cold plate and/or more than one separating structure. The shape of the separating structure 331 and cold plate 332, while illustrated as cubiods herein, may be any shape, such as discs, cubes, etc.

Figure 4:
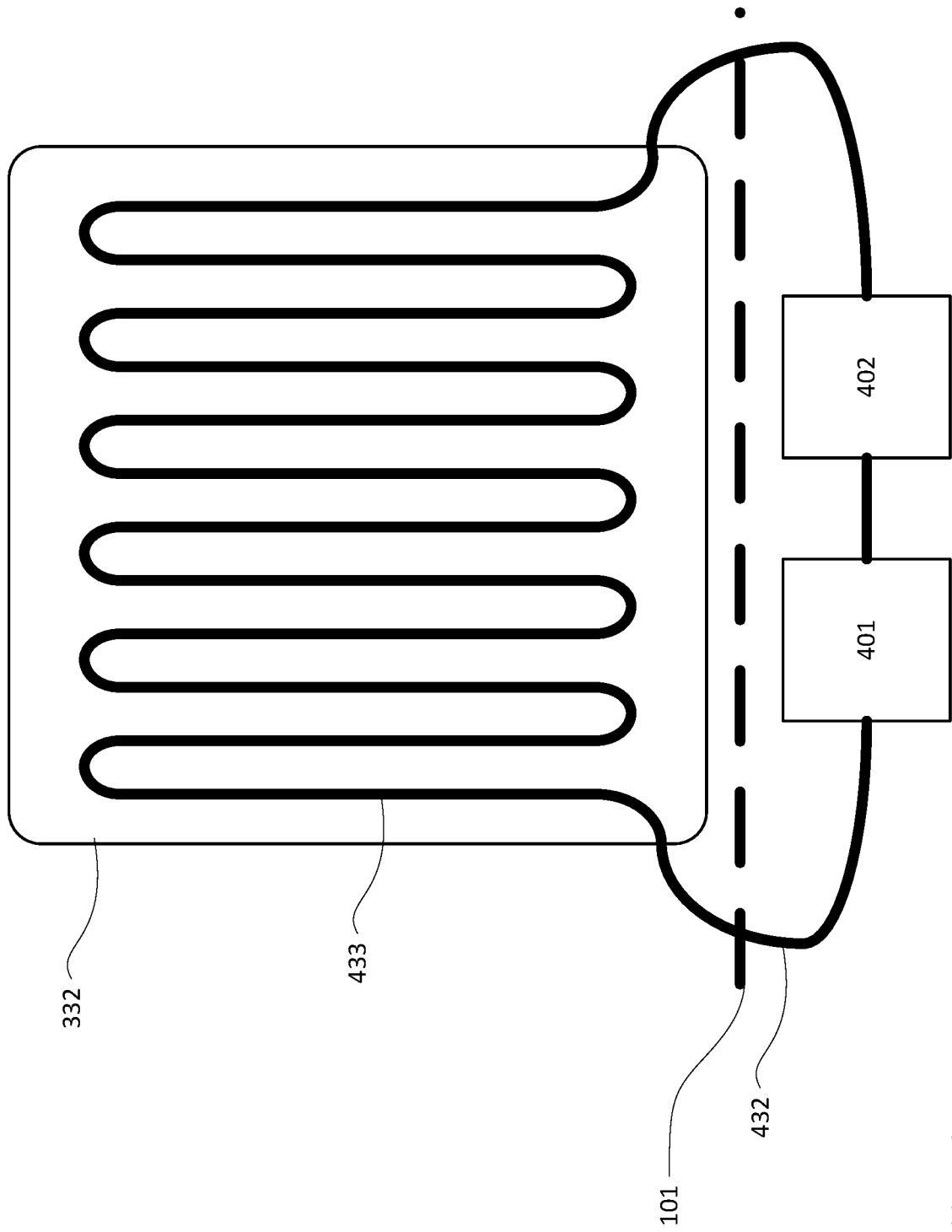
FIG. 4 is an example view of a cooling loop through a cold plate in accordance with aspects of the disclosure.

The cold plate 332 may be used to dissipate and otherwise remove the heat within the sensor housing generated by the internal sensor components 122 and external thermal radiation. For instance, and as illustrated in FIG. 4, the cold plate 332 may include a channel 433 positioned within or otherwise connected to the cold plate. A liquid cooling loop 432 may be configured to run through the channel 433. The cooling loop may cool electronics, such as processors, such as processor 342, and printed circuit boards (PCBs) attached thereto.

A cooling liquid, cooled to a predetermined temperature by a heat exchanger 401, may pass through the channel 332 having a predefined path within the interior of the cold plate 332, as shown in FIG. 4. The cooling liquid may cool the cold plate, which may in turn, draw the heat away from the processors, PCBs, and other such components attached to the cold plate 332. The heat drawn from the processors, PCBs, and other such components may be drawn into the cooling liquid, which is then passed out of the cold plate and the sensor housing 101.

A pump, such as pump 402 may control the flow rate of the cooling liquid within the cooling loop 432. In this regard, the flow rate of the cooling liquid may be between two to four liters per minute, or more or less, where the temperature of the cooling liquid is at a temperature of around 35 Celsius, or more or less. The flow rate of the cooling liquid should be such that the heat exchanger 401 located outside of the interior sensor has sufficient contact with and time to cool the cooling liquid back to the predetermined temperature.

The cooling liquid may be comprised of cooling fluids such as water, propylene glycol, ethylene glycol, or diethylene glycol. In some instances, the cooling liquid may be any combination of the foregoing fluids. In some examples, additives, such as anti-corrosion or antimicrobial compounds may be included in the cooling liquid.

Figure 5A:
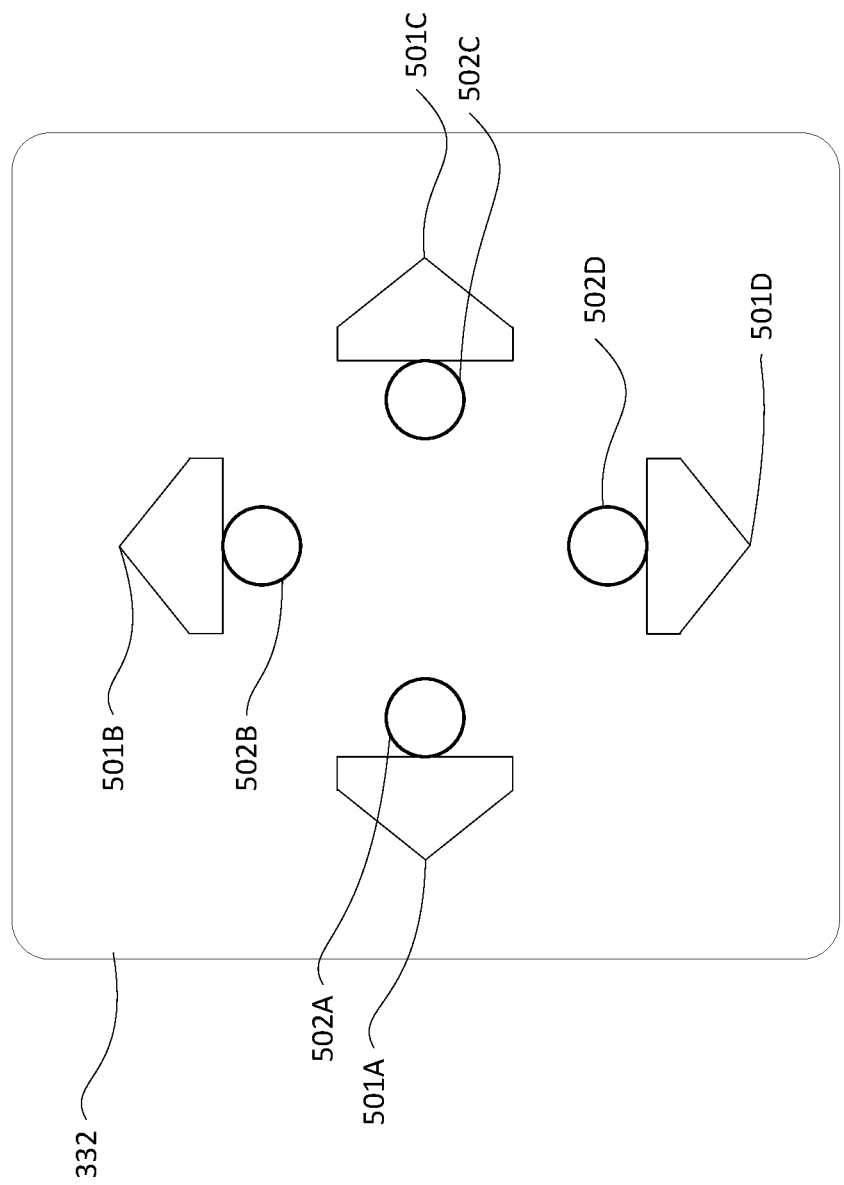
FIGS. 5A and 5B are examples of pass-throughs and mounts on a cold plate in accordance with aspects of the disclosure.
Figure 5B:
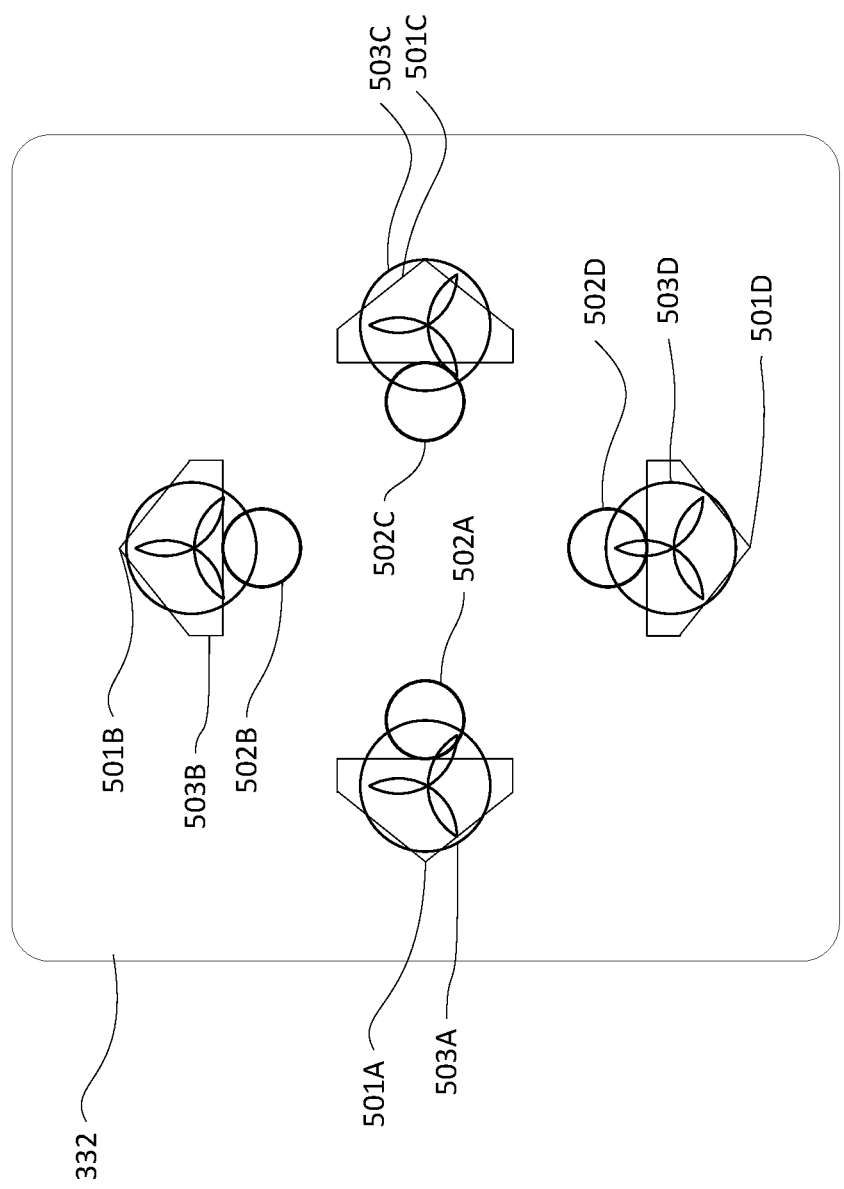

The cold plate may include mounts and pass-throughs or openings for a predefined number of fans to generate discrete air flows within the interior portions of the sensor cover. The pass-throughs may be passages through which air can circulate from one side of the cold plate to the other, opposite side of the cold plate. For example, and as illustrated in FIGS. 5A and 5B, the cold plate 332 has four pass-throughs 501A-501D, arranged 90 degrees apart from each other. Four mounts 502A-502D are each positioned in proximity to a respective pass-through 501A-501D.

The sensor housing may also include a plurality of fans. Each fan may be attached to the cold plate via a mount positioned in proximity to a respective pass-through, such that it can push or pull air through the respective pass-through. As such, each fan may be configured such that it pushes or pulls air or another fluid through the respective pass-through in proximity to where it is mounted. For instance, a fan may be mounted to each of the four mounts, with a first pair of neighboring fans being configured to pull air from the lower portion 303 into the middle portion of the sensor 302. The second pair of neighboring fans being configured to pull air from the middle portion 302 of the sensor and blow it into the lower portion. As an example, as shown in FIG. 5B, fans 503A-503D may be mounted to respective mounts 502A-502D. Fans 503A and 503B may be considered the first pair of neighboring fans. These fans may be configured to pull air from the lower portion 303 (in other words, from below the cold plate 332, to above the cold plate and into portions 302 and/or 301), as described here. Fans 503C and 503D may be considered the second pair of neighboring fans. These fans may be configured to pull air from the middle and/or upper portions 301 and 302 to the lower portion 303 (in other words, from above the cold plate 332 to below the cold plate and into portion 303), as described herein. Although FIG. 5B shows the fans as being mounted to the cold plate 332, the fans may be mounted to, or otherwise positioned, on other areas of the sensor, such as being suspended from an interior surface of the sensor housing 101.

Figure 6A:
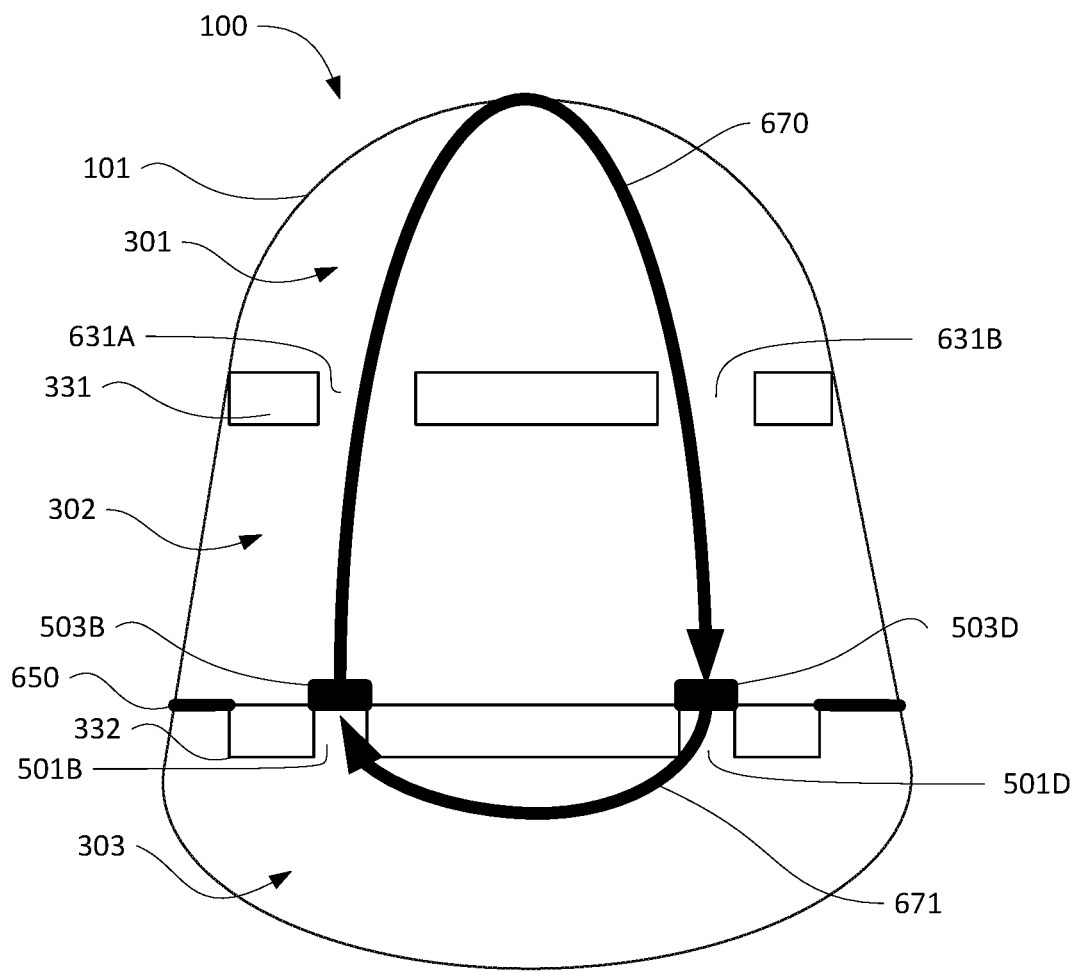
FIGS. 6A and 6B are illustrations of air flow loops within a sensor housing in accordance with aspects of the disclosure.

A pair of openings may be positioned on opposing ends of the separating structure to allow for air to circulate into and out of the upper portion. FIG. 6A provides a side, cutaway view of the interior of sensor housing 101 of sensor 100. As shown, the separating structure 331 has two openings 631A and 631B positioned above pass-throughs 501B and 501D, respectively. Openings 631A and 631B may allow for air to circulate into and out of the upper portion 301.

To generate an air flow loop capable of cooling the internal components situated in the upper portion 301 of the sensor housing 101, two opposing fans position, or otherwise mounted or attached, to the cold plate may work in tandem. In this regard, the two fans 503B and 503D may be positioned such that they are situated in proximity to the two openings 631A and 631B of the separating structure, respectively. When operated, fan 503B may pull air from below the cold plate and through pass-through 501B and blow that air through a first opening 631A of the separating structure. The fan 503D may pull air through the second opening 631B of the separating structure and blow that air through pass-through 501D of the cold plate 332. As such, a first air flow loop may circulate from below the cold plate 332, through the upper portion of the sensor, and back down through the cold plate 332, as illustrated by arrows 670 and 671. Alternatively, a single fan may be used to generate the first air flow loop.

Figure 6B:
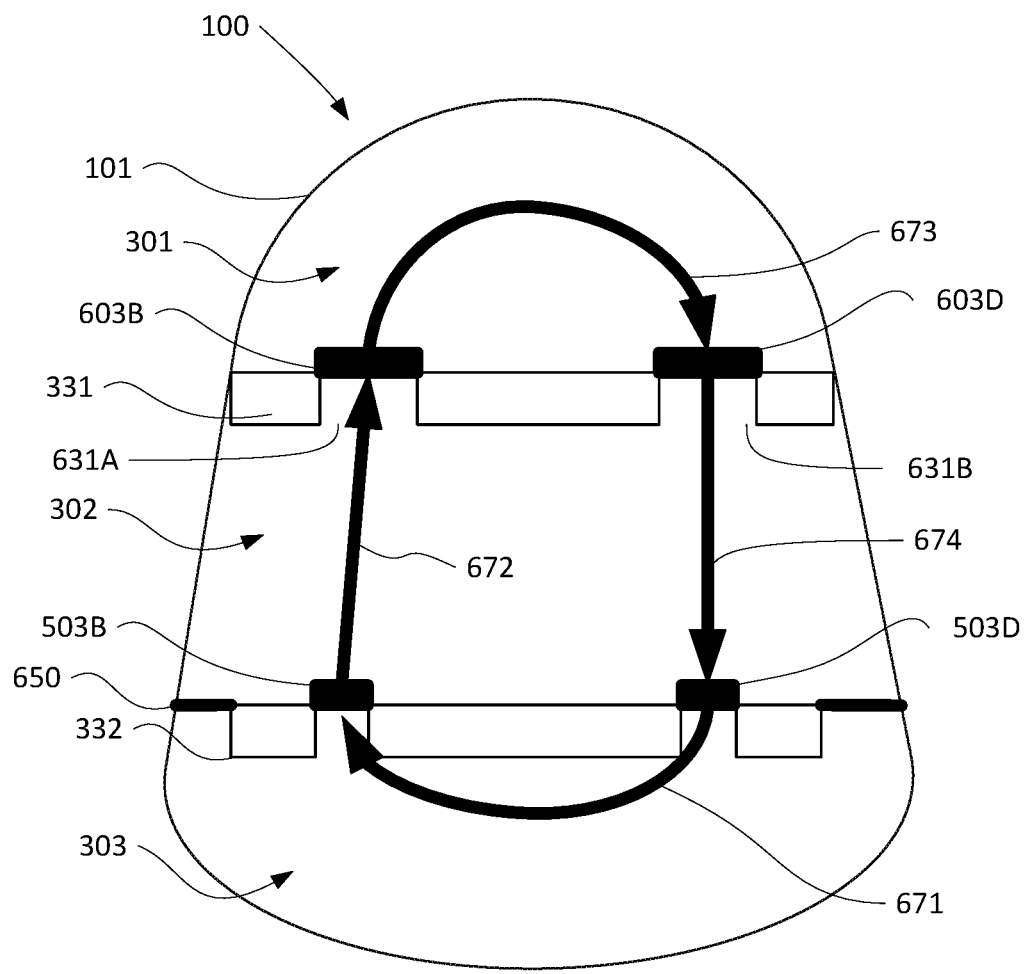

In some instances, a third pair of fans may be attached to the two openings of the separating structure to assist in generating the air flow loop cooling the internal components of the upper portion 301. For instance, a first of the fans of the third pair 603B, shown in FIG. 6B, may be positioned or mounted in proximity to opening 631A to assist in pulling air blown by fan 503B from the lower portion 303, below the cold plate 332, through the middle portion 302, and subsequently through opening 631A of the separating structure 331. A second of the fans of the third pair 603D, as further illustrated in FIG. 6B, may then assist in pulling the air from within the upper portion 301 and blowing it back through the separating structure 331 through opening 631B, where it will then be pulled from the middle portion 302 by fan 501D into the lower portion 303, thereby completing the first air flow loop, as illustrated by arrows 671-674.

Figure 7:
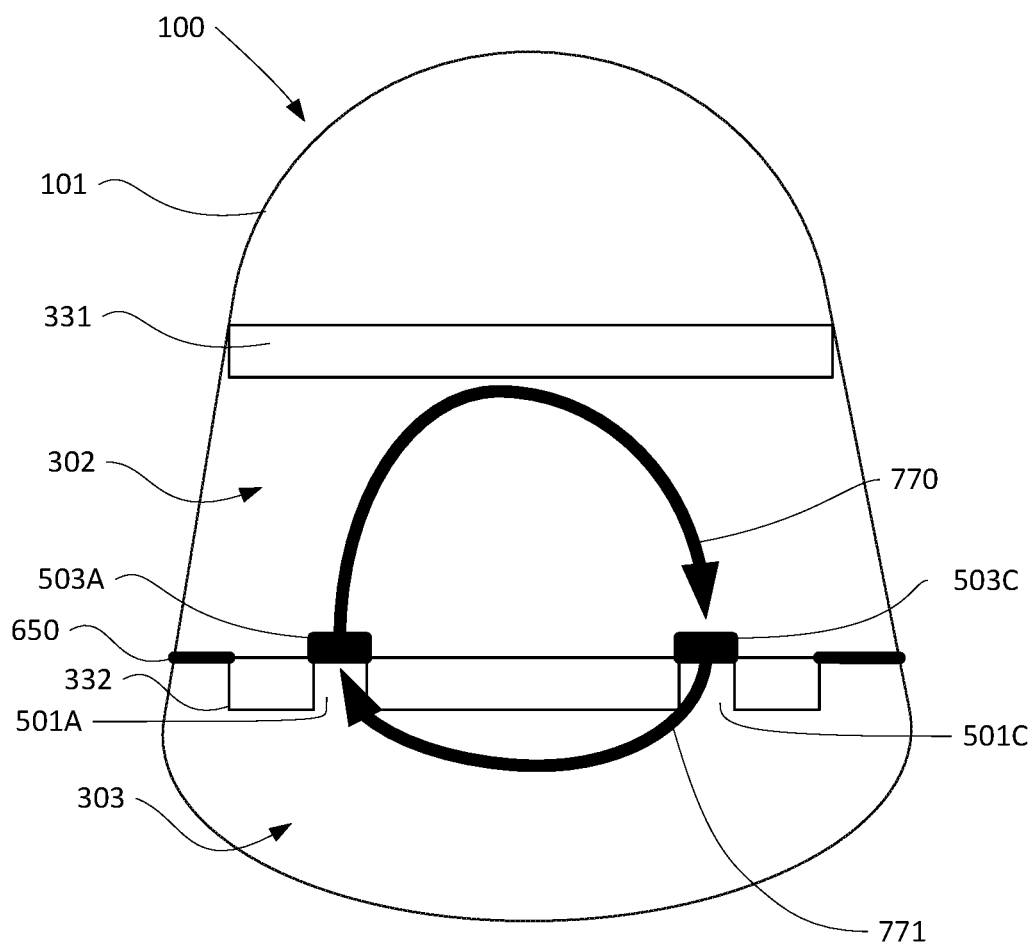
FIG. 7 is another illustration of an airflow loop within a sensor housing in accordance with aspects of the disclosure.

To generate a second air flow loop capable of cooling the internal components situated in the middle portion 302 of the sensor housing 101, the second pair of opposing fans positioned on the cold plate, may work in tandem. For instance, and as illustrated in FIG. 7, the second pair of opposing fans 503A and 503C may generate a second air flow loop illustrated as arrows 770 and 771, which is generally perpendicular to that of the first airflow loop generated by the first pair of opposing fans 503B and 503D. In this regard, fan 503A may pull air from below the cold plate 332 through pass-through 501A and into the middle portion 302. As no openings are located on the separating structure above the second pair of opposing fans, the second air flow loop may not circulate out of the middle portion 302 into the upper portion 301. The other fan 503C may pull the air from the middle portion 302 through the pass-through 501C into lower portion 503. As such, a second air flow loop may circulate from below the cold plate 332, through the middle portion of the sensor and back down through the cold plate 332, as illustrated by arrows 671 and 672 in FIG. 6B. In some instances, a single fan may be used to generate the second air flow loop.

Although the first and second air flow loops are illustrated as going in particular directions, the direction of the fans generating the air flow loops may be reversed and the directions of the first and second air flow loops may, in turn, also be reversed. As further illustrated in FIGS. 6A, 6B, and 7, a seal 650 is positioned around the cold plate 332 to prevent air and/or other fluids from passing between the lower portion 303 and middle portion 302, except through the pass-throughs 501A-501D.

Figure 8:
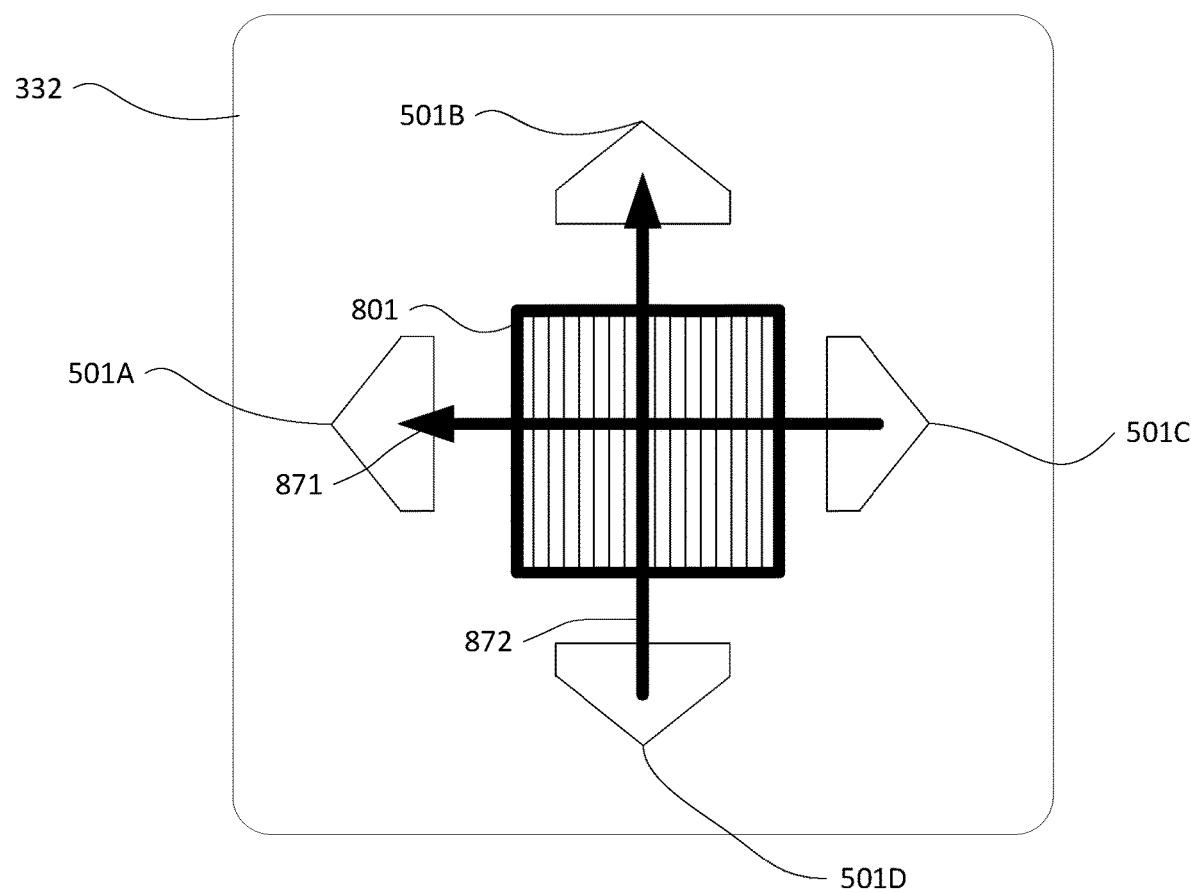
FIG. 8 is an illustration of a heat exchanger attached to a cold plate, in accordance with aspects of the disclosure.

A heat exchanger may be attached, or otherwise connected or mounted, to the base of the cold plate. The heat exchanger may be configured to pull heat from the air circulating at the base (i.e., the portion of the cold plate facing the lower portion of the sensor, as described herein,) of the cold plate and pass it into the cold plate, which in turn, passes it to the cooling liquid and out of the sensor, as described herein. The heat exchanger may be a plate heat exchanger, a fin stack, or other similar type device capable of exchanging heats between two mediums. For instance, FIG. 8 illustrates a heat exchanger 801, having a fin stack, mounted to the base of cold plate 332. As the two air flow loops, illustrated as arrows 871 and 872 respectively, flow from through the pass-throughs 501C and 501D, from the portions of the sensor above the cold plate (e.g., portions 302 and 301,) to the lower portion 303, the air flow loops may pass through the heat exchanger. The heat exchanger may pull the heat from the two air flow loops. The cooled air may then be blown back into the portions of the sensor above the cold plate through pass-throughs 501A and 501B.

Figure 9:
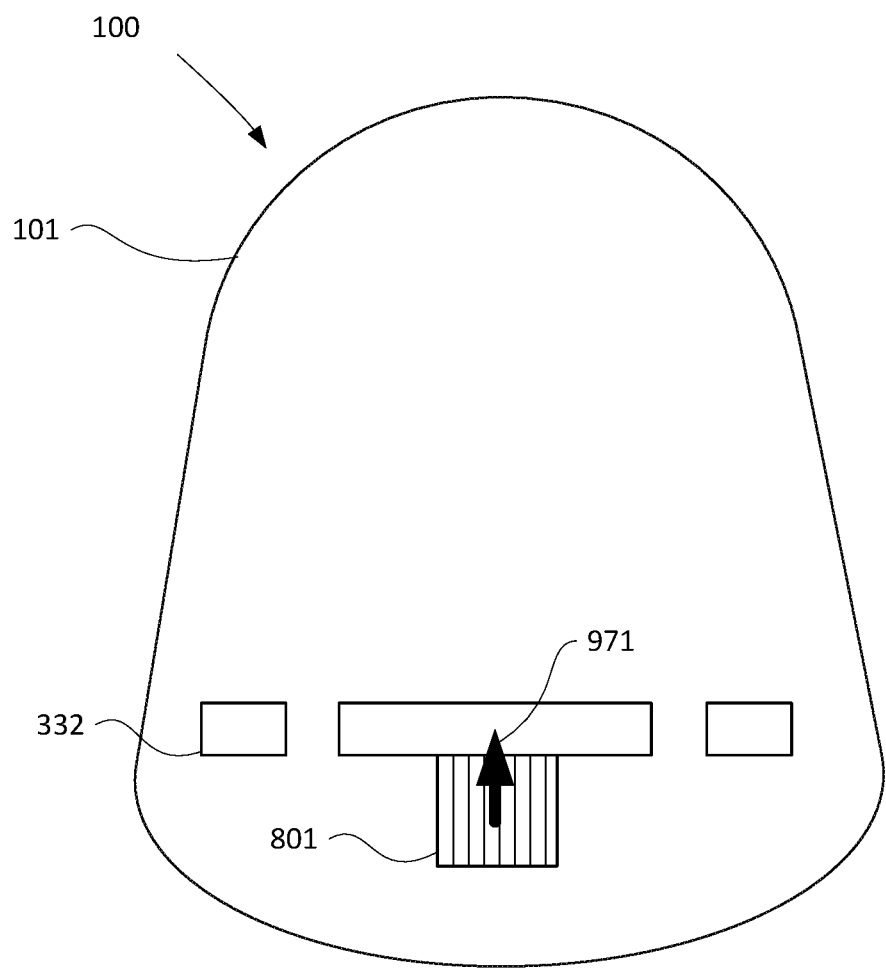
FIG. 9 is another illustration of a heat exchanger attached to a cold plate, in accordance with aspects of the disclosure.

The heat within the heat exchanger 801 may be transferred into the cold plate 332, as illustrated by arrow 971 in FIG. 9. In this regard, the cooling liquid within the cold plate may extract the heat from the cold plate. The cooling liquid, containing the heat extracted by the heat exchanger 801, may travel along the cooling loop and release the heat through the heat exchanger 401, located outside of the sensor housing 101, as described herein.

In addition to the operations described above and illustrated in the figures, various operations will now be described. It should be understood that the following operations do not have to be performed in the precise order described below. Rather, various steps can be handled in a different order or simultaneously, and steps may also be added or omitted. In one instance, the amount of heat within a sensor housing may be reduced by generating air flow loops. To generate an air flow loop capable of cooling at least some of the internal components situated a sensor housing, such as sensor housing 101, two opposing fans attached to the cold plate may work in tandem, with a first fan pulling air from below the cold plate and through a pass-through into the middle portion 302 and blow that air through an opening of a separating structure, such that the air is within the upper portion 301. The second fan may pull the air through a second opening of the separating structure and through the middle portion 302. The second fan may then blow the air through another pass-through of the cold plate 332. As such, a first air flow loop may circulate from below the cold plate 332, through the upper portion of the sensor, and back down through the cold plate 332.

A second, discrete air flow loop may be generated by another pair of fans within the sensor housing. A first fan of the second pair of fans may pull air from below the cold plate and through a pass-through into the middle portion 302. A second fan of the second pair of fans may then pull the air from the middle portion 302 blow the air through another pass-through of the cold plate 332. As such, the second air flow loop may circulate from below the cold plate 332, through the middle 302 portion of the sensor, and back down through the cold plate 332. The second, discrete air flow may be perpendicular to the first air flow.

The first and second airflow loops may be directed to pass through a heat exchanger attached to a cold plate. The heat exchanger may draw heat from the first and second air flows and pass the drawn heat into a liquid cooling loop running through the cold plate. The heat in the liquid cooling loop may then be expelled outside of the sensor housing by another heat exchanger located outside of the sensor housing. In some instances, the cooling liquid may be circulated by a pump. In some instances, the cold plate may draw heat from sensor components positioned in proximity to the cold plate, such as sensor components.

Figure 10:
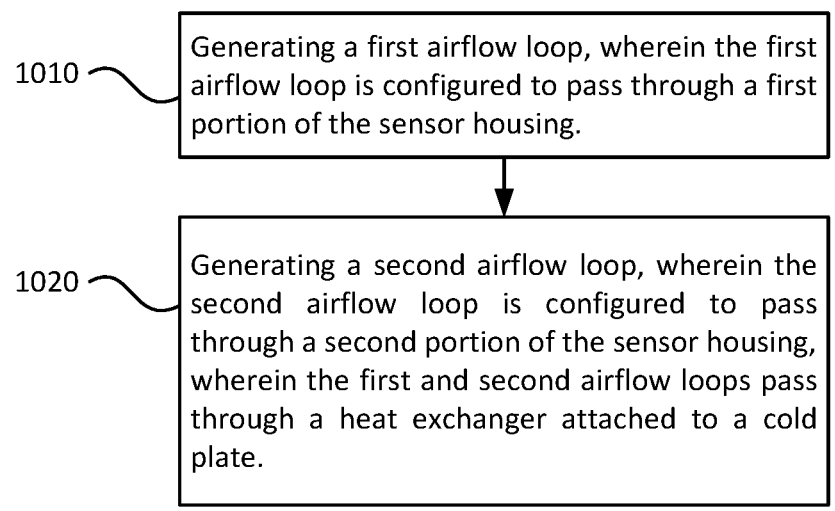
FIG. 10 is an example flow diagram in accordance with aspects of the disclosure.

Flow diagram 1000 of FIG. 10 shows some of the aspects described above which may be performed. In this example, a first air flow loop may be generated, wherein the first airflow loop is configured to pass through a first portion of the sensor housing, as shown in block 1010. A second airflow loop may be generated, wherein the second airflow loop is configured to pass through a second portion of the sensor housing, as shown in block 1020. The first and second air flow loops wherein the first and second airflow loops are generated such that they pass through a heat exchanger attached to a cold plate, as further shown in block 1020.

The features described herein allow for efficient dissipation of heat within the sensor housing. In this regard, separate air flow loops provide discrete, targeted cooling for different sections of the sensor housing. As such, the heat generated by the sensor components in each section of the sensor housing, as well as the heat generated by solar radiation may be effectively removed. In addition, a cold plate may draw the heat generated by sensor components and processors into a liquid cooling loop, to reduce the likelihood of the internal sensor components and processors from degrading and/or overheating.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A cooling system comprising:
   a sensor housing;
   a plurality of sensor components;
   a cold plate containing an interior liquid cooling channel containing a cooling fluid, wherein at least one of the plurality of sensor components is mounted on the cold plate, at least one of the plurality of sensor components is positioned in proximity to the cold plate, and the cold plate is configured to draw heat from the plurality of sensor components;
   a heat exchanger attached to the cold plate; and
   a plurality of fans configured to generate two air flow loops to reduce the heat within the sensor housing generated by the plurality of sensor components,
   wherein the cold plate includes a plurality of pass-throughs for allowing the two air flow loops to pass through the cold plate,
   wherein the heat exchanger is configured to draw heat from the two air flow loops and pass the drawn heat to the cold plate, which in turn, passes the drawn heat to the cooling fluid,
   wherein an interior of the sensor housing includes an upper portion, a lower portion, and a middle portion positioned between the upper portion and the lower portion, and a separating structure positioned between the upper portion and the middle portion, wherein at least one of the plurality of sensor components is mounted on the separating structure;
   wherein a first of the two air flow loops pulls air from the lower portion into the middle portion, and
   wherein a second of the two air flow loops pulls air from at least one of the middle portion or the upper portion into the lower portion.

2. The cooling system of claim 1, wherein the cooling fluid is one or more of water, propylene glycol, ethylene glycol, or diethylene glycol.

3. The cooling system of claim 2, wherein the cooling fluid contains at least one additive selected from a group of anti-corrosion or antimicrobial compounds.

4. The cooling system of claim 1, wherein the heat exchanger is a plate heat exchanger or a fin stack.

5. The cooling system of claim 1, wherein:
   the lower portion is positioned between the sensor housing and the cold plate; and
   the middle portion is positioned between the separating structure and the cold plate.

6. The cooling system of claim 1, wherein the first air flow loop is perpendicular to the second air flow loop.

7. The cooling system of claim 1, wherein the first of the two air flow loops is generated by a first fan of the plurality of fans and a second fan of the plurality of fans.

8. The cooling system of claim 7, wherein the first fan and the second fan are configured to blow in opposite directions.

9. The cooling system of claim 8, wherein the second of the two airflow loops is generated by a third fan of the plurality of fans and a fourth fan of the plurality of fans.

10. The cooling system of claim 9, wherein the third fan and the fourth fan are configured to blow in opposite directions.

11. The cooling system of claim 1, further comprising a pump, wherein the pump circulates the cooling fluid within a cooling loop.

12. The cooling system of claim 1, further comprising a second heat exchanger, wherein the cooling fluid passes through the second heat exchanger and the second heat exchanger cools the cooling fluid to a predefined temperature.

13. The cooling system of claim 12, wherein the second heat exchanger is positioned outside of the sensor housing.

14. The cooling system of claim 1, wherein each of the plurality of fans is mounted to a mount in proximity to a respective one of the plurality of pass-throughs.

15. The cooling system of claim 14, wherein two of the plurality of fans are configured to pull air through their respective pass-throughs and two of the plurality of fans are configured to push air through their respective pass-throughs.

16. A cooling system comprising:
   a sensor housing; wherein an interior of the sensor housing includes an upper portion, a lower portion, a middle portion positioned between the upper portion and the lower portion, and a separating structure positioned between the upper portion and the middle portion;
   a plurality of sensor components; wherein at least one of the plurality of sensor components is mounted on the separating structure;
   a cold plate containing an interior liquid cooling channel containing a cooling fluid, wherein at least one of the sensor components is mounted on the cold plate, and-at least one of the sensor components is positioned in proximity to the cold plate, and the cold plate is configured to draw heat from the plurality of sensor components;

a heat exchanger attached to the cold plate; and a plurality of fans configured to generate two air flow loops to reduce the heat within the sensor housing generated by the plurality of sensor components, wherein the heat exchanger is configured to draw heat from the two air flow loops and pass the drawn heat to the cold plate, which in turn, passes the drawn heat to the cooling fluid, and wherein the cold plate includes a plurality of pass-throughs for allowing the two air flow loops to pass through the cold plate.

17. The cooling system of claim 16, wherein two of the plurality of fans are configured to pull air through their respective pass-throughs and two of the plurality of fans are configured to push air through their respective pass-throughs.

18. The cooling system of claim 16, wherein each of the plurality of fans is mounted to a mount in proximity to a respective one or the plurality of pass-throughs.

19. The cooling system of claim 1, wherein the plurality of sensor components include at least one LIDAR device and a processor that are mounted or otherwise positioned within the upper portion of the sensor housing.

20. The cooling system of claim 1, wherein the at least one of the plurality of sensor components mounted on the cold plate is a processor, and the at least one of the plurality of sensor components positioned in proximity to the cold plate is a camera imaging sensor.

* * * * *

UNITED STATES PATENT AND TRADEMARK OFFICE
CERTIFICATE OF CORRECTION

PATENT NO. : 11,240,932 B1
APPLICATION NO. : 16/047429
DATED : February 1, 2022
INVENTOR(S) : Justin Matthew Andrade It is certified that error appears in the above-identified patent and that said Letters Patent is hereby corrected as shown below:

In the Claims

Claim 9, Column 10, Line 31:
Now reads: "airflow"; should read -- air flow --

Claim 16, Column 10, Line 66:
Now reads: "and-at"; should read -- at --

Signed and Sealed this
Tenth Day of May, 2022

Katherine Kelly Vidal
*Director of the United States Patent and Trademark Office*